(12) United States Patent
Pols Sandhu et al.

(10) Patent No.: US 6,927,968 B2
(45) Date of Patent: Aug. 9, 2005

(54) SECURITY MECHANISM FOR A NETWORK DEVICE

(75) Inventors: Yvetta D. Pols Sandhu, Winchester, MA (US); Andrew P. Tosh, Arlington, MA (US); William A. Izzicupo, Bedford, NH (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/285,651

(22) Filed: Oct. 31, 2002

(65) Prior Publication Data

US 2004/0085713 A1 May 6, 2004

(51) Int. Cl.[7] ................................................. H05K 5/00
(52) U.S. Cl. ..................... 361/679; 361/724; 312/223.1
(58) Field of Search ................................ 361/679, 683, 361/724, 725–727; 312/223.1–223.3, 117–120, 198, 199; 70/77–84, 85–173; 109/53, 67, 68

(56) References Cited

U.S. PATENT DOCUMENTS

| | | | | |
|---|---|---|---|---|
| 5,620,216 A | * | 4/1997 | Fuller | 292/337 |
| 5,816,672 A | * | 10/1998 | LaPointe et al. | 312/223.2 |
| 5,959,841 A | * | 9/1999 | Allen et al. | 361/725 |
| 6,628,512 B2 | * | 9/2003 | Searby et al. | 361/683 |
| 6,746,502 B2 | * | 6/2004 | Yair et al. | 55/385.6 |
| 2003/0226338 A1 | * | 12/2003 | Yair et al. | |

* cited by examiner

*Primary Examiner*—Yean-Hsi Chang
(74) *Attorney, Agent, or Firm*—Lahive & Cockfield, LLP

(57) ABSTRACT

An enclosure to control access to a selected portion of an enclosed electronic device is provided. The enclosure includes a plurality of access panels that are capable of being fastened in a secure position via a single fastener mechanism. The fastener mechanism is operable by an authorized individual. The fastener mechanism controls when each of the plurality of faceplates can be disengaged from the enclosure to access a portion of the electronic device.

20 Claims, 5 Drawing Sheets

SECURITY MECHANISM FOR A NETWORK DEVICE

TECHNICAL FIELD OF THE INVENTION

The present invention generally relates to an enclosure for an electronic device and, more particularly, to a security mechanism of the enclosure.

BACKGROUND OF THE INVENTION

Electronic devices, such as servers, routers, switches and other like devices are typically housed in an enclosure having one or more removable access panels to allow access to a portion of the device. In most instances the access panels provide access to one or more features or controls of the electronic device. If the device is rack mounted, the access panels may provide access to the device without having to remove the device from the rack. The access panels are often secured to a portion of the enclosure or to a portion of the electronic device by fasteners. Unfortunately, these fasteners provide little or no security to prevent unauthorized removal of the access panels, and, hence, the fasteners do not prevent unauthorized access to the features and controls of the electronic device.

SUMMARY OF THE INVENTION

The present invention addresses the above-described limitations of providing access panels in an enclosure for accessing an enclosed electronic device. The present invention provides an approach to fasten a number of access panels in a secure manner to prevent unauthorized access to the electronic device.

In one embodiment of the present invention, an enclosure for an electronic device is provided. The enclosure includes a number of panels that form a first portion of the enclosure. Each of the panels has an open position and a closed position to provide access to or to enclose a first portion of the electronic device. The first portion of the electronic device is enclosed when each of the panels is in its respective closed position. The enclosure includes a fastener mechanism mounted to one of the panels to secure each of the panels in its respective closed position. As such, when each of the panels is secured in its respective closed position, access to the first portion of the electronic device is impeded.

The fastener mechanism can be a lock having a pawl and a sliding member in communication with the pawl. A portion of the sliding member is capable of sliding through an opening in a first of the panels to engage a portion of a second of the panels so that each of the panels is secured in their respective closed positions. The first of the panels may also include a bracket to restrain movement of the sliding member in a desired direction. Optionally, the first panel can have two portions coupled via a hinge mechanism to allow a first of the portions to move from an open to closed position, or vice versa, while the second portion remains in a fixed position.

The above-described approach benefits a rack mountable electronic device, such as a server, router, switch, or other like electronic device. Because a rack assembly typically includes a lockable rear access door or panel to prevent unauthorized access to the units housed in the rack, the various features and controls for the device are placed at a location opposite of the rack's rear access door or panel. As such, the device's power switch, reset switch, various media drives, removable power supply assemblies, fan assemblies, and the like that are accessible from the front portion of the rack assembly can now be secured using a single fastener to prevent unauthorized access. Consequently, security and control over the electronic device is significantly improved.

In another embodiment of the present invention, a security mechanism for a device is provided. The security mechanism prevents unauthorized access to a selected portion of the device. The security mechanism includes a lock to fasten a plurality of faceplates to enclose a portion of the device, which, in turn, prevents unauthorized access to the selected portion of the device.

The security mechanism includes a lock bolt and a movable member linking the lock bolt and the lock so that the lock bolt is shot into or withdrawn from a catch by a key. A first of the faceplates includes a bore through which the lock is mounted. The first of the faceplates further includes a passage to allow a portion of the lock bolt to pass there through so that the lock bolt is shot into the catch or withdrawn from the catch by the key. A guide member is optionally provided with the first faceplate to guide a portion of the lock bolt through the passage. The catch includes a through hole in a portion of a second of the faceplates. The through hole has a size and shape suitable to receive the lock bolt.

A third faceplate is included that has one or more fasteners to fasten the third faceplate to a portion of the device. The third faceplate further includes a flange projecting from a first portion of the third faceplate for interfacing with a portion of the first faceplate. The third faceplate further includes a protrusion protruding from a second portion of the third faceplate, the protrusion interfaces with a portion of the second faceplate. When the flange of the third faceplate interfaces with the first faceplate and the protrusion of the third faceplate interfaces with the second faceplate, the plurality of faceplates are in a suitable position to have the lock bolt shot into the catch to fasten each of the faceplates in a secure position to prevent unauthorized access to the selected portion of the device.

The above-described approach benefits a rack mountable server. A single security mechanism is provided to secure a plurality of faceplates in a closed and secure position. Consequently, physical access to the server is limited to authorized personnel.

In still another embodiment of the present invention a server having a housing to house the server is provided. The housing includes a plurality of access panels providing access to a first portion of the server. The housing includes a lock assembly capable of securing each of the plurality of access panels in a secure position to limit access to the first portion of the server. One of the access panels includes a first portion and a second portion in communication with each other via a hinge. The second portion of the first access panel remains in a substantially fixed position, and the first portion turns on the hinge relative to the second portion of the one access panel. Optionally, the lock assembly is mounted to the first portion of the first access panel or optionally the lock assembly is mounted to the second portion of the first access panel to control physical access to the first portion of the server.

BRIEF DESCRIPTION OF THE DRAWINGS

An illustrative embodiment of the present invention will be described below relative to the following drawings, in which like reference characters refer to the same parts throughout the different views.

DETAILED DESCRIPTION

The illustrative embodiment of the present invention provides an enclosure, for housing an electronic device, having a fastener mechanism that is capable of securing a plurality of access panels in a secure position to prevent unauthorized physical access to the electronic device. In the illustrative embodiment, the enclosure is adapted to house a server in a rack assembly to prevent unauthorized access to various controls and components of the server using a single fastener mechanism.

In an illustrative embodiment, a single fastener mechanism of the enclosure is able to secure a plurality of access panels in a closed or secure position. As such, the plurality of access panels can be secured to prevent unauthorized access or, in the alternative, removed in whole or in part by one who is authorized to do so, to provide access to a portion of an electronic device. The enclosure allows an electronic device, such as a server, to be housed in a rack assembly, and allows for access control to a portion of the electronic device.

Figure 1:
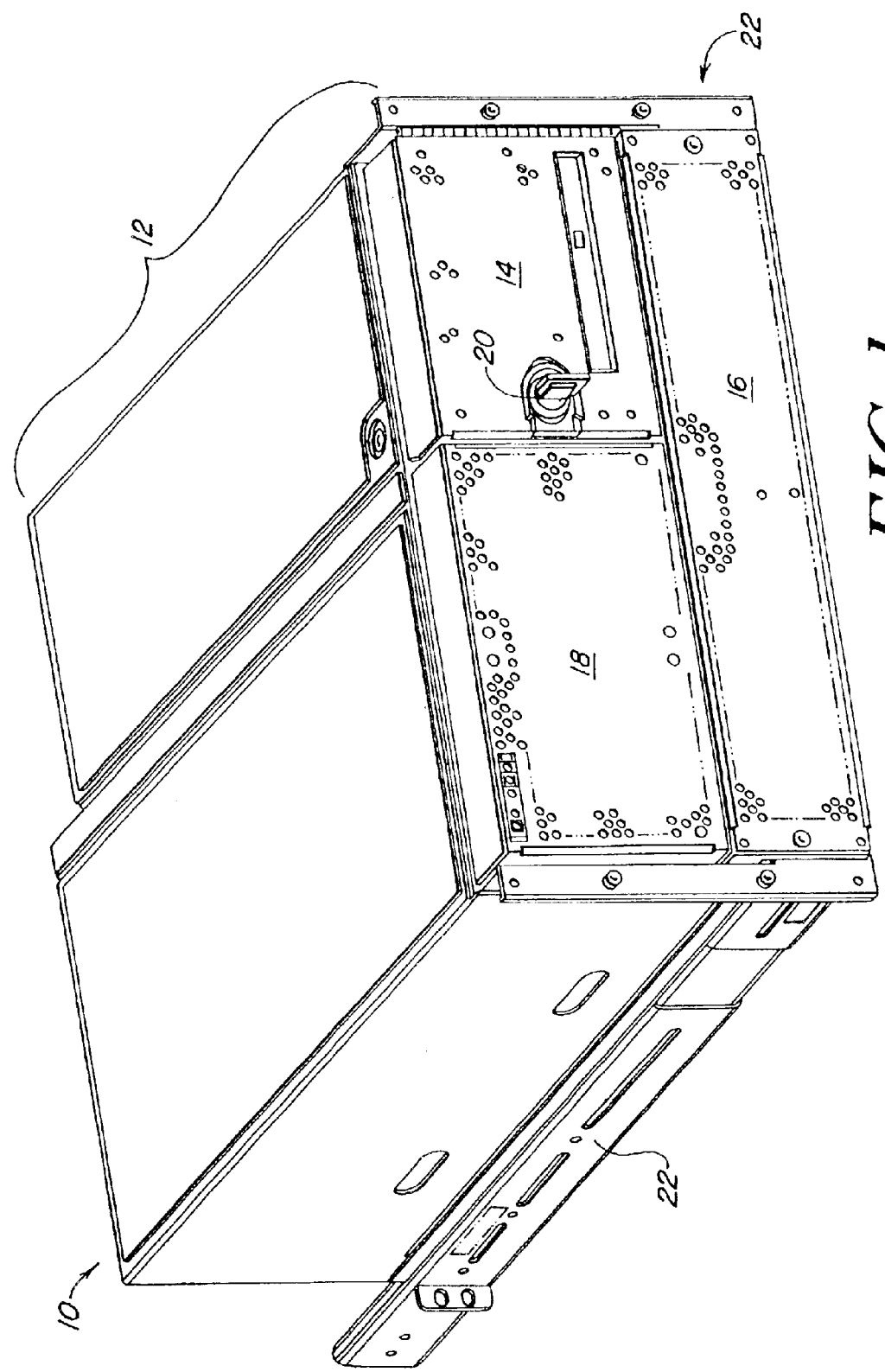
FIG. 1 illustrates a perspective view of an enclosure for an electronic device suitable for use in practicing the illustrative embodiment of the present invention.

FIG. 1 illustrates an exemplary electronic device 10 suitable for use in practicing an illustrative embodiment of the present invention. The exemplary electronic device 10 includes an enclosure 12 having a first access panel 14, a second access panel 16, and a third access panel 18, to allow access to a first portion of the exemplary electronic device 10. The first access panel 14 includes a bore through which is mounted a fastener mechanism 20. The fastener mechanism 20 operates to secure each of the plurality of access panels 14, 16 and 18. The enclosure 12 further includes a plurality of slide assemblies 22 (one slide assembly illustrated) to allow the enclosure 12 to slide into and out of a suitable rack assembly. Those skilled in the art appreciate that as discussed herein, the term access panel is used synonymously with the term faceplate to describe the removable panels that provide access to a portion of the electronic device.

The exemplary electronic device 10 is capable of being configured as and operating as a server, a router, a switch, or other network operable device. Each of the plurality of access panels, 14, 16, and 18, are optionally configured to include one or more through holes to provide air circulation to the electronic device when each of the plurality of access panels 14, 16, and 18 is in its respective closed position. Moreover, those skilled in the art will recognize that each of the plurality of access panels 14, 16, and 18, can be configured as, or configured to include an RF filter if necessitated by the operating environment. Each of the plurality of access panels 14, 16, and 18, have a respective open state or position, and closed state or position, which are discussed below in more detail. FIG. 1 illustrates each of the plurality of access panels 14, 16, and 18 in its respective closed state or position.

Figure 2:
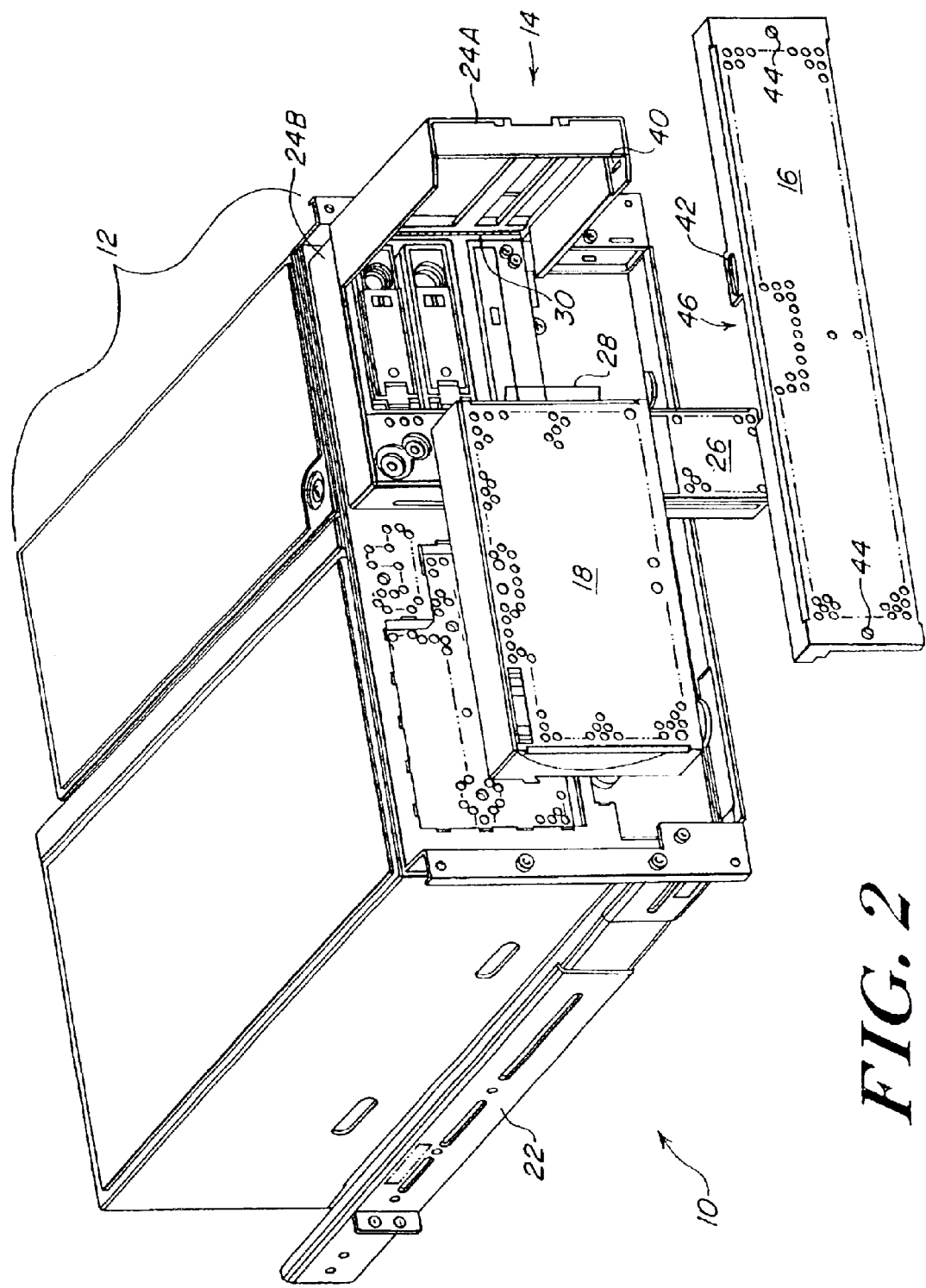
FIG. 2 illustrates a second perspective view of the electronic device showing a partially exploded view of various access panels that are suitable for practicing the illustrative embodiment of the present invention.

FIG. 2 illustrates the enclosure 12 in a partially exploded view. The first access panel 14 includes a first portion 24A coupled to a second portion 24B via a hinge 30. The first portion 24A includes a passage 40 through which a portion of a sliding member or lock bolt passes to engage a catch 42 in the second access panel 16. The second access panel 16 includes a notched portion 46 sized and shaped to accommodate a protrusion 26 protruding from the third access panel 18.

Figure 2A:
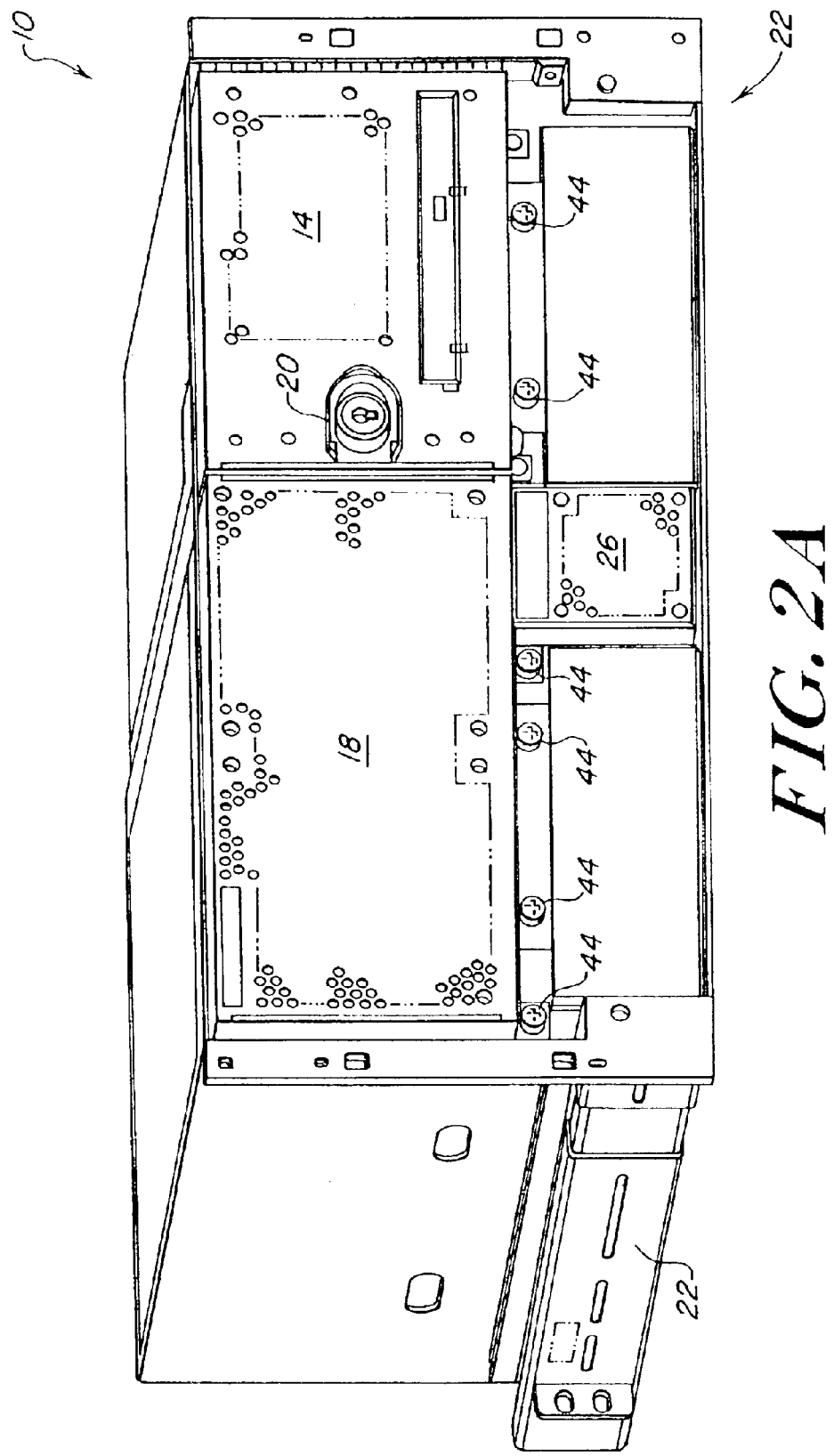
FIG. 2A illustrates a third perspective view of the electronic device showing various access panels that are suitable for practicing the illustrative embodiment of the present invention.

FIGS. 2 and 2A illustrate that the second access panel 16 like the third access panel 18, and the first access panel 14 include a plurality of fasteners 44 suitable for engaging the second access panel 16, the third access panel 18 and the second portion 24B of the first access panel 14 to a portion of the exemplary electronic device 10 or in the alternative to a portion of the enclosure 12. Those skilled in the art will recognize that the fasteners 44 can be threaded fasteners and that the fasteners 44 can be configured as captive fasteners with or without a spring mechanism.

Optionally, the third access panel 18 includes a flange portion 28 that interfaces with the first portion 24A of the first access panel 14. The flange portion 28 sits or lies behind the first portion 24A when the first portion 24A of the first access panel 14 is in its closed position or state. FIG. 2 illustrates the first access panel 14 in its open state or position and as such, the first portion 24A is in its open state or position. Moreover, FIG. 2 illustrates the second access panel 16 and the third access panel 18 in their respective open states or positions.

To secure access to the first portion of the exemplary electronic device 10 the third access panel 18 is the first panel placed in its closed state or position. The plurality of fasteners 44 are engaged with the first portion of the exemplary electronic device 10 or alternatively with a portion of the enclosure 12 to fasten the third access panel 18 in its closed state or position. When the third access panel 18 is in its closed state or position, the second access panel 16 is fastened to the first portion of the exemplary electronic device 10 or alternatively with a portion of the enclosure 12 using the plurality of fasteners 44. The second access panel 16 is positioned so that the protrusion 26 interfaces with the notch 46 to prevent the third access plate 18 from being removed from its closed state or position while the second access plate 16 is in its closed state or position. Upon interfacing the notch 46 and the protrusion 26, the plurality of fasteners 44 are engaged with the exemplary electronic device 10 or alternatively with the enclosure 12 to fasten the second access panel 16 in its closed position or state.

In like manner, the first portion 24A of the first access panel 14 is placed in its closed position or state so that the passage 40 and the catch 42 are aligned. If the flange 28 is included as part of the third access panel 18 then when the first portion 24A of the first access panel 14 is placed in its closed position or state the flange 28 is substantially covered by a portion of the first portion 24A to secure the third access panel 18 in its closed state or position.

To secure access to the front portion of the exemplary electronic device 10, each of the plurality of access panels 14, 16 and 18 needs to be in its respective closed state or position, see FIG. 1. Once each of the plurality of access panels 14, 16 and 18 are in its respective closed state or position, the fastener mechanism 20 is operated to drive a portion of a lock bolt 32 (illustrated in FIGS. 3 and 4), through the passage 40 to engage the catch 42 and secure each of the plurality of access panels 14, 16 and 18 in its respective closed state or position. To access the first portion of the exemplary electronic device 10 when the plurality of access panels 14, 16, and 18 are in the secure state, the fastener mechanism 20 is operated with a key to withdraw a portion of the lock bolt 32 from the catch 42 to place each of the plurality of access panels 14, 16, and 18 in an unsecured state allowing access to the first portion of the exemplary electronic device 10. In this fashion, a single fastener mechanism can operate to secure a plurality of access plates of faceplates to prevent unauthorized access to a portion of the exemplary electronic device 10.

Figure 3:
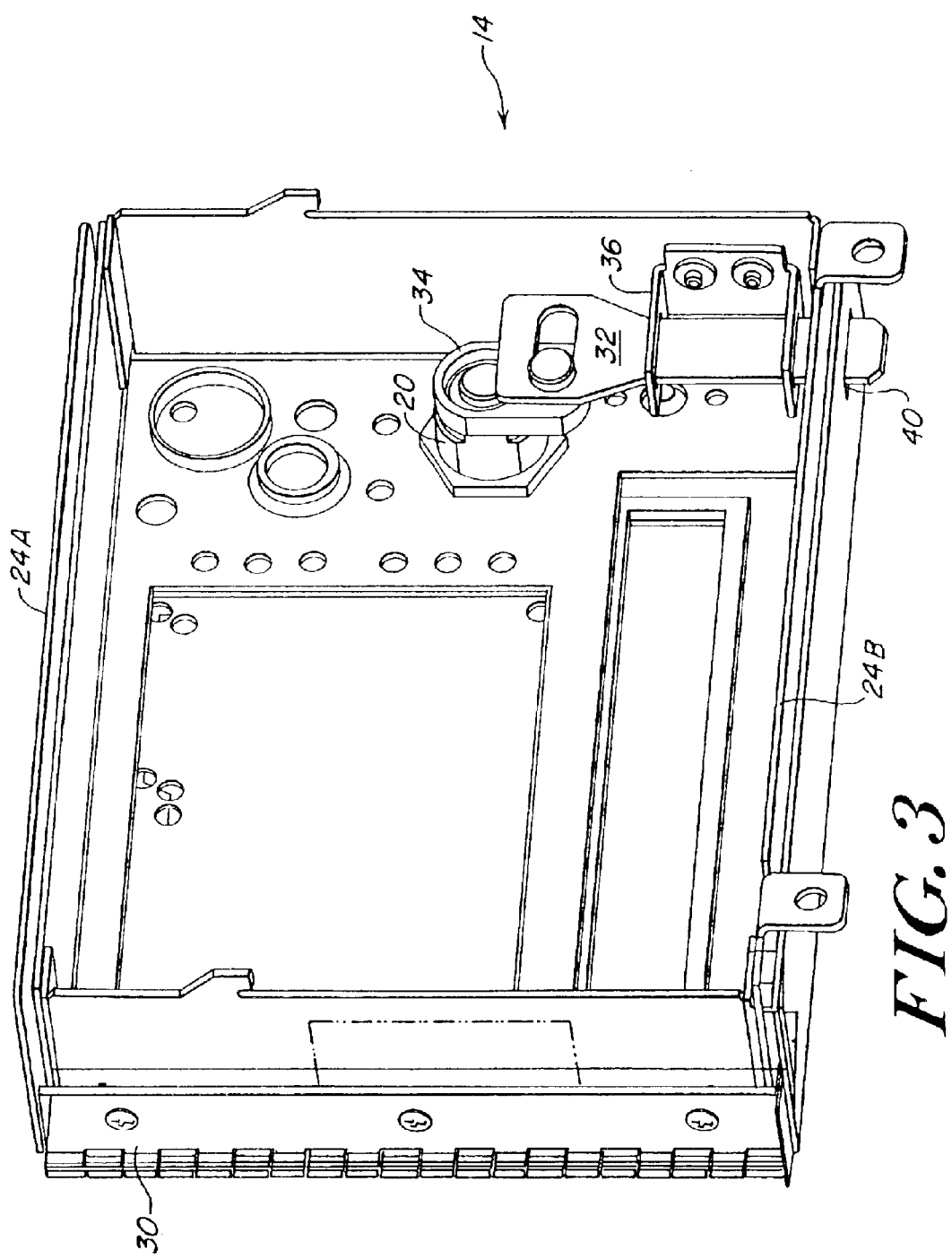
FIG. 3 illustrates a rear elevation view of an access panel having mounted thereto a security mechanism suitable for securing each of the access panels illustrated in FIGS. 1, 2 and 2A.

FIG. 3 illustrates the first access panel 14 in more detail. In accordance with FIG. 3, when the first access panel 14 is secured in its closed position or state a portion of the lock bolt 32 extends through the passage 40 to engage the catch 42 (FIG. 2). The first access panel 14 is configurable to include a guide bracket 36 to restrain movement of the lock bolt 32 to a desired direction.

The fastener mechanism 20 is mounted through a bore in the second portion 24B of the first access panel 14. The fastener mechanism 20 is coupled to a pawl 34. The pawl 34 is coupled to the lock bolt 32. In operation, a key is placed in the fastener mechanism 20 and turned in a desired direction to either engage the lock bolt 32 with the catch 42 or to withdraw the lock bolt 32 from the catch 42. When the key is turned in the fastener mechanism 20, the pawl 34 rotates in a manner to cause the lock bolt 32 to move in the direction directed by the turning of the key.

Figure 4:
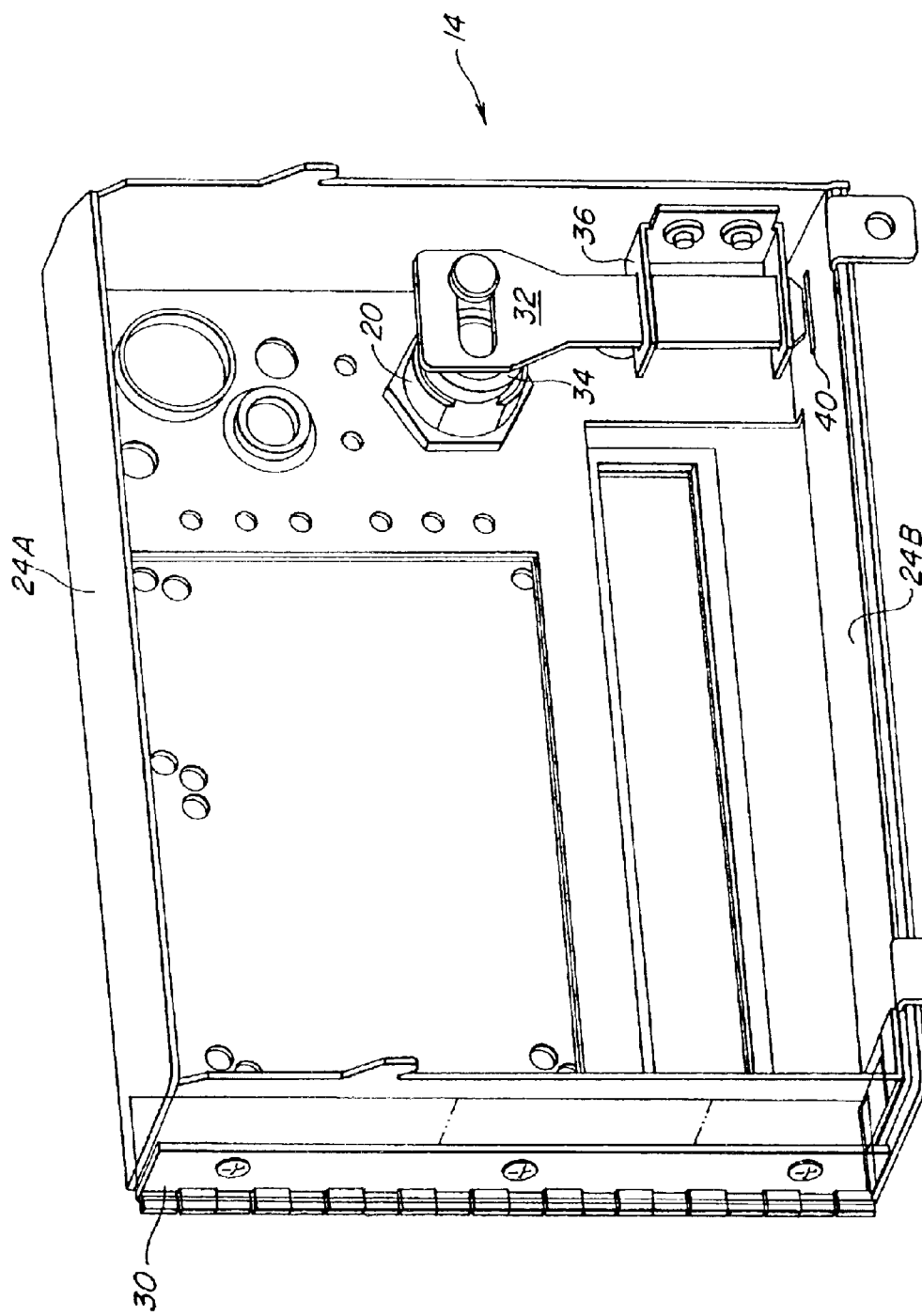
FIG. 4 illustrates an additional rear elevation view of an access panel having mounted thereto a security mechanism suitable for securing each of the access panels illustrated in FIGS. 1, 2 and 2A.

FIG. 4 illustrates the first access panel 14 having an alternative mounting location for the fastener mechanism 20. Optionally, the fastener mechanism 20 is mounted to the first portion 24A of the first access panel 14. In this manner, the fastener mechanism 20, the lock bolt 32, the pawl 34, and the optional guide bracket 36 move with the first portion 24A between its open and closed positions or states. In addition, the first access panel 14 is illustrated with the lock bolt 32 withdrawn from the catch 42 to allow access to the first portion of the electronic device 10.

While the present invention has been described with reference to an illustrative embodiment thereof, one skilled in the art will appreciate that various changes in form and detail may be made without parting from the intended scope of the present invention as defined in the pending claims. For example, the fastener mechanism 20 can be mounted to one of the other access panels 16 and 18 to control access to a selected portion of the exemplary electronic device 10. Moreover, each of the front access panels can be configured to include one or more hinges or other like mechanisms to prevent misplacement of the front access panels when in their respective open positions or states.

What is claimed is:

1. An enclosure for an electronic device, the enclosure comprising:

a plurality of panels to form a first portion of the enclosure, each of first, a second, and a third of the plurality of panels having an open position to allow access to the first portion of the electronic device, and a closed position to enclose the first portion of the electronic device and to prevent unauthorized access to the first portion of the electronic device, wherein the first portion of the electronic device is enclosed when each of the plurality of panels is in its respective closed position; and a fastener mechanism mounted to the first of the plurality of panels to secure each of the first, the second, and the third of the plurality of panels in its respective closed position, wherein when each of the plurality panels is secured in its respective closed position access to the first portion of the electronic device is impeded.

2. The enclosure of claim 1, wherein the fastener mechanism comprises a lock.

3. The enclosure of claim 2, wherein the lock comprises:

a pawl; and a sliding member in communication with said pawl, wherein a portion of the sliding member is capable of sliding through an opening in the first of the plurality of panels to engage a portion of the second of the plurality of panels so that each of the plurality of panels is secured in their respective closed positions.

4. The enclosure of claim 3, wherein the first of the plurality of panels comprises:

a bracket to restrain movement of said sliding member, said bracket having at least one passage through which the portion of said sliding member passes.

5. The enclosure of claim 4, wherein the first of the plurality of panels further comprises:

a fastener on which the first of the plurality of panels moves between the open position and the closed position, the fastener fastening the first of the plurality of panels to a second portion of the enclosure.

6. The enclosure of claim 1, wherein the enclosure is a rack mount enclosure for mounting the electronic device in a rack.

7. The enclosure of claim 6, wherein the enclosure further comprises one or more slide assemblies to slidably engage the enclosure with the rack.

8. A security mechanism for a device, the security mechanism preventing unauthorized access to a selected portion of the device, the security mechanism comprising:

a lock operated by a key; and a lock bolt mounted to a first of a plurality of faceplates to fasten together each of the first, a second, and a third of the plurality of faceplates of an enclosure enclosing the device to prevent unauthorized access to the selected portion of the device, each of the first, the second, and the third of the plurality of faceplates having an open position and a closed position to enclose the enclosure, wherein the device is enclosed when each of the plurality of faceplates is in its respective closed position.

9. The security mechanism of claim 8, wherein the lock comprises:

a moveable member linking the lock bolt and the lock so that the lock bolt is shot into or withdrawn from a catch by said key.

10. The security mechanism of claim 9, wherein the first of the plurality of faceplates comprises a bore through which the lock is mounted.

11. The security mechanism of claim 10, wherein the first of the plurality of face plates further comprises:

a passage to allow a portion of the lock bolt to pass therethrough so that the lock bolt is shot into the catch or withdrawn from the catch by the key; and a guide member to guide the portion of the lock bolt through the passage.

12. The security mechanism of claim 10, wherein the third of the plurality of faceplates comprises:

one or more fasteners to fasten the third of the plurality of faceplates to a portion of the device;

a flange projecting from a first portion of the third of the plurality of faceplates, the flange interfacing with a portion of the first of the plurality of faceplates; and a protrusion protruding from a second portion of the third of the plurality of faceplates, the protrusion interfacing with the second of the plurality of faceplates, wherein when the flange interfaces with the portion of the first of the plurality of faceplates and the protrusion interfaces with the portion of the second of the plurality of faceplates, the plurality of faceplates are in a suitable position to have the lock bolt shot into the catch to fasten each of the plurality of faceplates in a secure position and prevent unauthorized access to the selected portion of the device.

13. The security mechanism of claim 9, wherein the catch comprises a through hole in a portion of the second of the plurality faceplates, the through hole having a size and shape suitable to receive the portion of the lock bolt.

14. The security mechanism of claim 13, wherein the second of the plurality of faceplates is attached to the device with one or more fasteners, the second of the plurality of faceplates being removable from the electronic device when the lock bolt is withdrawn from the catch and each of the one or more fasteners is in a state of disengagement from the device.

15. The security mechanism of claim 8, wherein the device comprises, one of a server, a router and a switch.

16. A server, comprising:

a housing to house the server, the housing having a plurality of access panels providing access to a first portion of the server; and a lock assembly mounted to a first of the plurality of access panels capable of securing each of the first, a second, and a third of the plurality of access panels in a secure position to limit access to the first portion of the server, each of the first, the second, and the third of the plurality of access panels having an open position and a closed position to enclose a first portion of the server, wherein the first portion of the server is enclosed when each of the plurality of access panels is in its respective closed position.

17. The server of claim 16, wherein a selected one of the plurality of access panels includes a first portion and a second portion in communication with each other via a hinge, wherein the second portion remains in a substantially fixed position and the first portion turns on said hinge relative to the second portion of the selected access panel.

18. The server of claim 17, wherein the lock assembly is mounted to the first portion of the selected access panel.

19. The server of claim 17, wherein the lock assembly is mourned to the second portion of the selected access panel.

20. The server of claim 16, wherein the housing comprises a rack mountable housing for mounting the server in a rack assembly.

* * * * *